United States Patent
Wu

(10) Patent No.: US 9,157,019 B2
(45) Date of Patent: Oct. 13, 2015

(54) THERMAL CONDUCTIVITY IMPROVED COMPOSITION WITH ADDITION OF NANO PARTICLES USED FOR INTERFACE MATERIALS

(71) Applicant: Jiali Wu, Yorktown Heights, NY (US)

(72) Inventor: Jiali Wu, Yorktown Heights, NY (US)

(73) Assignee: Jiali Wu, Yorktown Heights, NY (US)

( * ) Notice: Subject to any disclaimer, the term of this patent is extended or adjusted under 35 U.S.C. 154(b) by 351 days.

(21) Appl. No.: 13/850,343

(22) Filed: Mar. 26, 2013

(65) Prior Publication Data

US 2014/0293546 A1   Oct. 2, 2014

(51) Int. Cl.
| | |
|---|---|
| C09K 5/14 | (2006.01) |
| H05K 7/20 | (2006.01) |
| B82Y 30/00 | (2011.01) |
| C08K 3/22 | (2006.01) |

(52) U.S. Cl.
CPC .............. C09K 5/14 (2013.01); H05K 7/20509 (2013.01); *B82Y 30/00* (2013.01); *C08K 3/22* (2013.01); *H01L 2924/00* (2013.01); *Y10T 428/2982* (2015.01)

(58) Field of Classification Search
CPC ............ C08K 3/22; C08K 3/08; B22B 15/00; H01M 2/0285; H01M 2002/0297; B82Y 30/00; C01P 2004/60; C01P 2004/61; C01P 2004/62; C01P 2004/64; C08L 83/00; B32B 2264/10; C09K 5/14; Y10T 428/2982; H05K 7/20509

See application file for complete search history.

(56) References Cited

U.S. PATENT DOCUMENTS

| | | | | |
|---|---|---|---|---|
| 8,729,543 | B2* | 5/2014 | Jackrel et al. | 257/42 |
| 8,840,799 | B2* | 9/2014 | Rowe et al. | 252/62.3 T |
| 2003/0234074 | A1* | 12/2003 | Bhagwagar | 156/325 |
| 2008/0285211 | A1* | 11/2008 | Zaghib et al. | 361/528 |
| 2010/0248419 | A1* | 9/2010 | Woodruff et al. | 438/95 |
| 2012/0279697 | A1* | 11/2012 | Forray et al. | 165/185 |
| 2013/0105854 | A1* | 5/2013 | Jang et al. | 257/100 |
| 2013/0334557 | A1* | 12/2013 | Uchida et al. | 257/98 |
| 2014/0345843 | A1* | 11/2014 | Kirkor et al. | 165/185 |

* cited by examiner

*Primary Examiner* — Michael Zarroli

(57) ABSTRACT

A ternary particle size filler composition with addition of nano particles is provided to formulate thermally conductive interface materials such as soft gel having a high thermal conductivity, a relative low viscosity, and a low complex storage modulus. The thermally conductive material containing thermal particle composition and polymer matrix is used to create a thermal transfer path between the electronic component and the heat dissipation member. The composition is a mixture of a ternary particle size fillers constituted of the same or different chemical compounds in a predefined size ranges and volume ratios in terms of low viscosity and thermal interface nominal size. A silicone based polymer used as filler bonding matrix contains base resin, dispersant, cross-linker and polymerization catalyst. Thermal conductivity of the soft gel varied according to the change of volume percentage, particle size, and chemical compound of individual thermal particles.

3 Claims, 2 Drawing Sheets

THERMAL CONDUCTIVITY IMPROVED COMPOSITION WITH ADDITION OF NANO PARTICLES USED FOR INTERFACE MATERIALS

BACKGROUND

Electronic component generates heat and the heat needs to be dissipated efficiently for the device to function properly. A common expedient for this purpose is to transfer heat from electronic component (FIG. 1-5) to a heat spreader (FIG. 1-2) and heat sink (FIG. 1-1) through an integrated thermal path, which was established by attaching a heat spreader directly on the electronic component using thermally conductive interface materials (FIG. 1-4, 3). Effectiveness of heat dissipation is dominated by thermal conductivity and mechanical integrity of the interface materials.

Due to the relentless pursuit of computing performance and functionality, improving heat dissipation becomes one of the central issues. The recent trend in microprocessor architecture has been to increase the number of transistors, shrink processor size, and increase clock speeds in order to meet the market demand. As a result, the high-end microelectronic components are experiencing ever growing total power dissipation and heat fluxes, which increase the demand for effective means of heat dissipation.

Thermal interface material plays a key role in improving thermal dissipation efficacy. Thermal conductivity efficiency is disproportional to the nominal average thickness of thermal interface as illustrated in FIG. 1. Along with material thermal conductivity improvement, shorten thermal dissipation path across the thermal interface material linearly reduce the thermal resistance, but at a price of increasing stress introduced by thermal mismatch between silicone electronic component and heat spreader. Low viscosity and low modulus of thermally conductive materials is prominent to the reliability of electronic products, such as single chip module (SCM) and multichip module (MCM) as shown in FIGS. 1 and 2.

Thermal interface material is conventionally classified into following categories: sheet, grease, adhesive and gel. EP2532723A1 disclosed a formulation of polyacrylic based thermal sheet with rigid mechanical property, which yields non-compliant property. Thermal grease is prepared by mixing a silicone oil or polyolefin oil (U.S. Pat. No. 6,114,429, U.S. Pat. No. 5,591,789) with thermally conductive fillers. Poor cohesion, a parasitic disadvantage of thermal grease, results in "pump out" issue and explains its incapability as a conductive media for the organic packaging application. Thermal adhesives proposed in US 20120279697A1 uses polyester as polymeric liquid matrix, which produces strong interfacial adhesion with high rigidity, lacking of flexibility to accommodate mismatched thermal expansion introduced mechanical stress, especially associated to an interface with a nominal size of less than 250 um.

WO2004072181 proposed a range of formulations for silicone thermally conductive gels. However, the thermal conductivity claimed in the invention fall into the range of 3.5-4.2 W/mK with no consideration about thermal particle size and volume percentage selection.

In general, high thermally conductive filler loading is needed for high thermal conductivity. Thermal conductivity of commercial available conductive gel ranges from 1-4.5 W/m·K, and thermal gel with thermal conductivity greater than 3.5 W/mK tends to be too thick to satisfy thermal interface bonding application with nominal gap size of 250 um and below.

SUMMARY OF THE INVENTION

Figure 1:
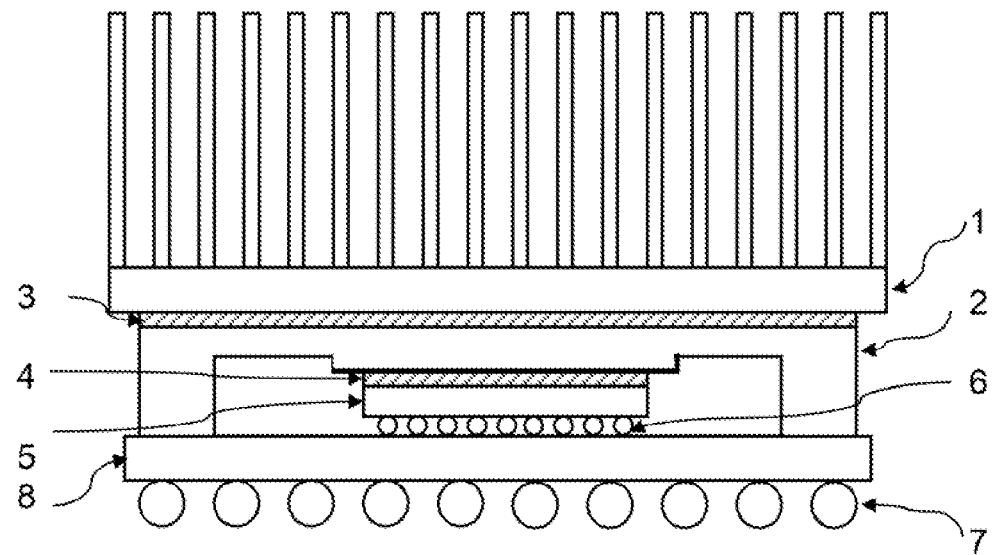
FIG. 1 is a integrated Single Chip Module (SCM) with a heat spreader and a sink.

Bearing in mind of the aforementioned problems and requirements of prior art, the present invention is to provide a thermally conductive composition which can be used to make thermal interface materials such as soil gel having a wide range of thermally conductive filler loading constituted of the same or different chemical compounds to generate a wide range of thermal conductivity ranging from 4-8 W/mK, with a relative low viscosity, a low complex storage modulus, and good thermal stability. A highly desirable thermally conductive gel formulated with the composition herein provides a thermal conductivity of 4-8 W/mK, a viscosity of less than 350 Pa·s and a complex storage modulus of less than 100 kPa.

The relative low viscosity of the thermal gel is obtained by using a ternary particle size filler composition with defined particle size, volume ratio with addition of nano particles. A filler particle size composition consists of particles with the same or different chemical compounds composed as following:

Thermally conductive composition I, comprising;

Large thermally conductive filler has a particle size range from 1-10 um, preferred 4-8 um in an amount of about 40 to 80 volume %, preferred 60 to 65 volume %;

Small thermally conductive filler has a particle size range from 0.1-5 um, preferred 0.5-2 um in an amount of about 5 to 30 volume %, preferred 10 to 15 volume %;

Nano thermally conductive filler has a particle size range from 10-800 nm, preferred 50-300 nm in an amount of about 10 to 40 volume %, preferred 15 to 30 volume %;

Volume ratio of large thermally conductive filler to small thermally conductive filler is about 1:2 to 20:1, preferably 2:1 to 10:1;

Volume ratio of large thermally conductive filler to nano thermally conductive filler is about 1:3 to 15:1, preferably 2:3 to 6:1;

Volume ratio of small thermally conductive filler to nano thermally conductive filler is about 5:1 to 1:5, preferably 1:1 to 1:3;

Thermally conductive composition II, comprising:

Large thermally conductive filler has a particle size range from 20-40 um, preferred 23-28 um in an amount of about 45 to 75 volume %, preferred 58 to 62 volume %;

Small thermally conductive filler has a particle size range from 5-20 um, preferred 8-12 um in an amount of about 5 to 40 volume %, preferred 15 to 25 volume %;

Nano thermally conductive filler has a particle size range from 10-800 nm, preferred 100-300 nm in an amount of about 10 to 50 volume %, preferred 25 to 30 volume %;

Volume ratio of large thermally conductive filler to small thermally conductive filler is about 1:3 to 15:1, preferably 3:2 to 8:1

Volume ratio of large thermally conductive filler to nano thermally conductive filler is about 1:2 to 10:1, preferably 2:1 to 5:1

Volume ratio of small thermally conductive filler to nano thermally conductive filler is about 3:2 to 1:4, preferably 1:1 to 1:3.

The low complex storage modulus is obtained by using silicone based liquid matrix with a low crosslink density comprising vinyl-Si containing organopolysiloxane base resin, organopolysilane dispersant, H—Si containing crosslinker and vinyl-containing platinum complex catalyst.

Improved high thermal conductivity of interface materials was obtained by loading a ternary particle size composition of thermal filler into silicone liquid matrix with a volume percentage from 65-95 volume % of conductive filler and 5-40 volume % of polymeric liquid, preferably 78-90% conductive filler and 10-22 volume % of polymeric liquid.

Figure 2:
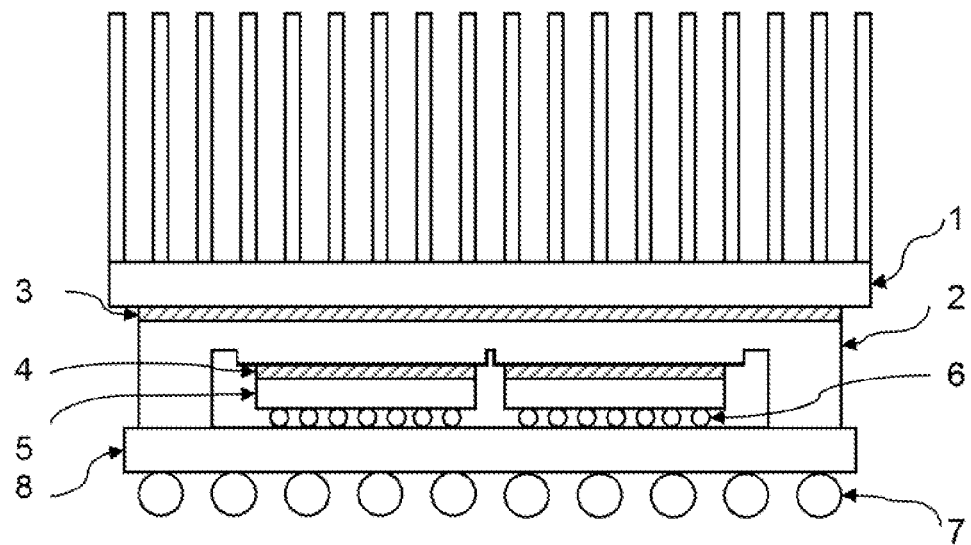
FIG. 2 is a integrated Multi Chip Module (MCM) with a heat spreader and a sink.

An integrated electronics module with thermal management design is illustrated in FIG. 1 and FIG. 2. FIG. 1 is a single chip module (SCM), including 1 processor chip. FIG. 2 is a multichip module (MCM), including 2 or more silicon processor chips and or memory chips for the present invention. The module comprises one or more heat generating electronics components, its font side was electrically attached to the organic substrates (chip carrier) via lead-free solder (C4) (FIG. 1-6, FIG. 2-6) through 260 C high temperature reflow. The organic substrate with carried chip (or chips) was then electrically attached to the print circuit board through 240-260 C high temperature ball grid array (BGA) solder (FIG. 1-7, FIG. 2-7) reflow. A thermal dissipating member, such as a heat spreader is mounted on the back of electronic component with its planar pedestal surface extending over the chip. An invented thermal interface material is located in the heat conducting path between electronic component and heat spreader. The heat sink is then mounted on the package in heat conducting relation with the integrated heat spreader is the invented thermal interface gel. The thermally conductive interface materials provided by the present invention can be used for an interface with nominal average thickness of 250 um and below.

The invented thermal material can be used for similar interface heat conducting purpose in applications such as LED, solar cell, MEMS devices, and wind mill, and medical devices, etc.

DESCRIPTION OF THE INVENTION

Thermally conductive filler is an important component for improving the bulk thermal conductivity of the thermal materials. There is a wide range of thermal fillers can be used in the practice of the invention. Examples of these fillers include metals, such as aluminum, cupper, gold, silver and the like, ceramics, such as aluminum oxide, aluminum nitride, silicon carbide, diamond, zinc oxide, boron nitride, and the like, silver coated aluminum, carbon fibers, alloys and any combinations thereof. Aluminum and cupper are preferred because of their demonstrated thermal conductivity, availability and cost effectiveness. Surface of the thermally conductive fillers may be rendered hydrophobic by treatment with organic siloxane organopolysilane, hydroxyl stearic acid ester, or other type of dispersant.

Increase thermal conductivity filler loading is a common approach to increase thermal conductivity of interface materials. However, when filler loading percentage exceeds 80% of volume percentage, the resulting composition becomes poor in terms of processability, and is incapable to cover the indentation on the surface of heat spreader. To lower the relative viscosity at the same filler loading percentage, a ternary particle size filler composition is adopted in the present invention. Particles in spherical or cubic octahedral shape are preferred to reduce sliding obstacle.

Large particles provide high bulk thermal conductivities. However, they also give higher interface bonding thickness that reduces thermal performance. Therefore, the average particle size must be selected in a range that balances these factors for a high performance for an interface material. Typically, the average particle size is less than about 100 um for the aforementioned application. Addition of small particles is to increase the particle packing density, so as to the thermal conductivity. The effect of anno particle to polymer is to disentangle polymeric chain so as to lower viscosity (LiY, etc. phys Rev Lett). In addition, nano particles directly contacts micro particles to reduce contact interface between micro particle and polymer liquid matrix, further increase filler loading in thermally conductive mixtures.

Liquid polymer matrix acts as a filler bonder as well as lubricant among the thermally conductivity particles. In device cooling application, thermal gel with low storage modulus serves as a stress absorbent due to mismatched thermal expansion to maintain mechanical integrity of thermal interface in a nominal thickness of 250 um and below. To exclude "pop-out' issue, a polymer constructed with flexible chain and low crosslink density is preferred (U.S. Pat. No. 7,932,342). Polymer matrixes used satisfied the above mentioned can be polysiloxane, polyurethane, polybutadiene modified epoxy, siloxane modified epoxy, polyacrylic, etc.

A thermally conductive gel material can be prepared by mixing together the above mentioned polymeric matrix with a ternary particle size filler composition together using a planetary mixer, then a three roll mill. A mixture prepared in this manner exhibits a dramatically improved homogeneity, thermal conductivity, and relatively low viscosity.

A rheometer with strain control was used for monitoring curing reaction of thermal interface material with different filler composition. In each test, about 0.5 gram of thermal interface material was placed between tow 25 mm parallel plats with a gap of 1 mm, the sample was heated to 125 C at a rate of 10 C/min and held at 125 C for 60 min while subjecting the sample to a shear strain of 10%. Viscosity at 25 C prior to cure and complex storage modulus at 125 C after 30 min cure were obtained form the measurement.

Thermal conductivity of interface materials with different composite was measured using NanoFlash thermal conductivity analyzer. A layer of the thermal interface material with a thickness of 75 um was sandwiched between two circular aluminum plates of diameter 12.6 mm and thickness of 1 mm. the sample was applied by a pressure of 20 psi at 25 C for 15 min and then subjected to 125 C for 60 min.

A thermally conductive silicone interface material of present invention is applied to the thermal management module to form dissipating path illustrated in FIG. 1. The invented material was displaced or screen printed on the heat generated electronics component, followed by placing down heat spreader on top with seal band adhesives around its perimeter within a fixture to secure its relative position to the electronics component. Then subjected the how integrated component to 125 C cure. For heat sink attachment, the invented thermal material was dispensed or printed on the surface of heat spreader prior to applying the heat sink right on the top with a certain pressure. With such a thermal management configuration, heat can be effectively transmitted to ambient environment from the heat-generating component.

EXAMPLES

As following is a more detailed description of the present invention using a series of comparative examples, although the present invention is in no mean limited by these examples.

A silicone based polymeric liquid matrix was used for thermal gel preparation. It comprises a vinyl-terminated organopolysiloxane (1), a hydrogen-terminated organopolysiloxane (2), an organopolysilane (3), and a vinylsiloxane complexed chloroplatinic acid mixed with triallylisocyanurate. Organic molecules are illustrated as following.

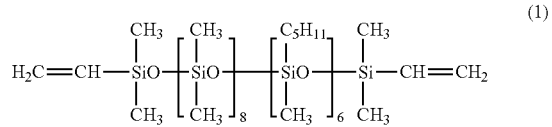
(1)

A ternary particle size filler composition I (table I) with controlled particle size ratio and volume percentage ratio is as following:

Large thermally conductive filler has a particle size range from 1-10 um, preferred 4-8 um in an amount of about 40 to 80 volume %, preferred 60 to 65 volume %;

Small thermally conductive filler has a particle size range from 0.1-5 um, preferred 0.5-2 um in an amount of about 5 to 30 volume %, preferred 10 to 15 volume %;

Nano thermally conductive filler has a particle size range from 10-800 nm, preferred 50-300 nm in an amount of about 10 to 40 volume %, preferred 15 to 30 volume %;

Volume ratio of large thermally conductive filler to small thermally conductive filler is about 1:2 to 20:1, preferably 2:1 to 10:1;

Volume ratio of large thermally conductive filler to nano thermally conductive filler is about 1:3 to 15:1, preferably 2:3 to 6:1;

Volume ratio of small thermally conductive filler to nano thermally conductive filler is about 5:1 to 1:5, preferably 1:1 to 1:3;

TABLE I

| Example # | Filler Volume % wrt Total Formulation Volume % | Volume % Individual Filler Particle wrt Total Solids Filler Type | | | | | | Volume Ratios | | | Viscosity at 25 C. Pa·s | Storage Modulus at 125 C. kPa | Thermal Conductivity W/m K |
|---|---|---|---|---|---|---|---|---|---|---|---|---|---|
| | | Large 4-8 um | | Small 0.5-2.0 um | | Nano 50-300 nm | | L/S | L/N | S/N | | | |
| | | Al | Cu | Al | Cu | Al | Diamond | | | | | | |
| 1 | 78.6 | 54 | | 28 | | 18 | | 1.9 | 3.0 | 1.6 | 241 | 42 | 6.3 |
| 2 | 80.2 | 57 | | | 18 | 25 | | 1.8 | 2.3 | 0.0 | 272 | 57 | 6.6 |
| 3 | 83.2 | | 41 | 32 | | 27 | | 1.5 | 0.0 | 1.2 | 313 | 51 | 6.2 |
| 4 | 81.2 | 49 | | 23 | | | 28 | 2.1 | 1.8 | 0.8 | 279 | 49 | 6.7 |
| 5 | 83.7 | 58 | | | 16 | 26 | | 3.6 | 2.2 | 0.6 | 305 | 59 | 6.9 |
| 6 | 83.8 | 60 | | 21 | | 19 | | 2.9 | 3.2 | 1.1 | 305 | 61 | 7.3 |
| 7 | 82.1 | | 67 | 14 | | 19 | | 4.8 | 3.5 | 0.7 | 336 | 65 | 7.3 |
| 8 | 83.1 | 57 | | 24 | | 19 | | 2.4 | 3.0 | 1.3 | 303 | 65 | 7.3 |
| 9 | 84.3 | 58 | | 18 | | 24 | | 3.2 | 2.4 | 0.8 | 311 | 69 | 7.6 |
| 10 | 83.4 | 62 | | 17 | | | 21 | 3.6 | 3.0 | 0.8 | 324 | 73 | 8.3 |

-continued

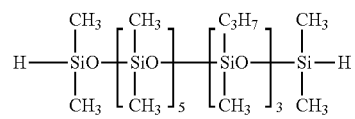
(2)

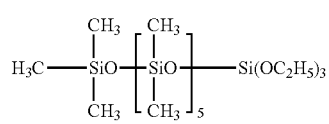
(3)

Wherein a thermally conductive filler composition mixed with silicone polymeric liquid matrix to form a curable thermally conductive gel. The thermal gel comprises about 65-95 volume % conductive filler and 5-40 volume % polymeric liquid, preferably 78-90% conductive filler and 10-22 volume % of polymeric liquid.

A ternary particle size filler composition II (Table II) with controlled particle size ratio and volume percentage ratio is as following:

Large thermally conductive filler has a particle size range from 20-40 um, preferred 23-28 um in an amount of about 45 to 75 volume % preferred 58 to 62 volume %;

Small thermally conductive filler has a particle size range from 5-20 um, preferred 8-12 um in an amount of about 5 to 40 volume %, preferred 15 to 25 volume %;

Nano thermally conductive filler has a particle size range from 10-800 nm, preferred 100-300 nm in an amount of about 10 to 50 volume %, preferred 25 to 30 volume %;

Volume ratio of large thermally conductive filler to small thermally conductive filler is about 1:3 to 15:1, preferably 3:2 to 8:1;

Volume ratio of large thermally conductive filler to nano thermally conductive filler is about 1:2 to 10:1, preferably 2:1 to 5:1;

A-2, Small thermally conductive filler has a particle size range from 0.1-5 um, preferred 0.5-2 um in an amount of about 5 to 30 volume %, preferred 10 to 15 volume %;

A-3, Nano thermally conductive filler has a particle size range from 10-800 nm, preferred 50-300 nm in an amount of about 10 to 40 volume %, preferred 15 to 30 volume %;

TABLE II

| Example # | Filler Volume % wrt Total Formulation Volume % | Large 23-28 um Al | Large 23-28 um Cu | Small 8.0-12 um Al | Small 8.0-12 um Cu | Nano 100-300 nm Al | Nano 100-300 nm Diamond | L/S | L/N | S/N | Viscosity at 25 C. Pa·sec | Storage Modulus at 125 C. kPa | Thermal Conductivity W/m K |
|---|---|---|---|---|---|---|---|---|---|---|---|---|---|
| 1 | 76.4 | 52 |    | 22 |    | 26 |    | 2.4 | 2.0 | 0.8 | 226 | 49 | 5.9 |
| 2 | 78.1 | 55 |    |    | 20 | 25 |    | 1.7 | 2.2 | 0.0 | 233 | 54 | 6.1 |
| 4 | 80.2 | 50 |    | 23 |    |    | 27 | 2.2 | 1.9 | 0.9 | 270 | 53 | 6.5 |
| 3 | 82.2 |    | 43 | 32 |    | 25 |    | 1.3 | 0.0 | 1.3 | 314 | 63 | 6.9 |
| 5 | 83.9 | 53 |    |    | 28 | 19 |    | 1.9 | 2.8 | 1.5 | 323 | 55 | 7.1 |
| 6 | 83.8 | 63 |    | 18 |    | 19 |    | 3.5 | 3.3 | 0.9 | 296 | 67 | 7.4 |
| 9 | 82.7 | 59 |    | 21 |    | 20 |    | 2.8 | 3.0 | 1.1 | 287 | 60 | 7.2 |
| 7 | 83.4 |    | 57 | 25 |    | 18 |    | 2.3 | 3.2 | 1.4 | 331 | 69 | 6.9 |
| 8 | 81.1 | 56 |    | 18 |    | 26 |    | 3.1 | 2.2 | 0.7 | 265 | 52 | 7.0 |
| 10 | 83.7 | 52 |    | 23 |    |    | 25 | 2.3 | 2.1 | 0.9 | 331 | 78 | 8.5 |

Volume ratio of small thermally conductive filler to nano thermally conductive filler is about 3:2 to 1:4, preferably 1:1 to 1:3.

Wherein a thermally conductive composition is mixed with silicone polymeric liquid to thrill a curable thermally conductive gel. The thermal gel comprises about 65-95 volume % conductive filler and 5-40 volume % polymeric liquid, preferably 78-90% conductive and 10-22 volume % of polymeric liquid.

About 0.5 g of thermally conductive mixtures prepared according to the above formula were dispensed on a pair of parallel plates and subjected to measurement of viscosity at 25 C and complex storage modulus at 125 C after 60 min cure. Viscosity and storage modulus of tested examples are below 350 Pa·s and 100 kPa respectively under a control of 10% shear strain and 75 um sample thickness.

The present invention provides an electronic thermal management method for integrated single chip module (SCM) and multichip module (MCM), comprising one or more heat generating electronic components, a heat spreader and a heat sink, a layer of thermally conductive gel between electronic component and heat spreader as well as beat spreader and heat sink.

Thermally conductive gels of this invention thermally and mechanical survived multiple 260 C BGA reflows.

I claim:

1. A ternary particle size thermally conductive filler composition with the addition of nano particles, the conductive filler having either of two distinct compositions:
   (A) Composition I comprising controlled particle size ratio and volume percentage ratio as follows:
   A-1 Large thermally conductive filler has a particle size range from 1-10 um, preferred 4-8 um in an amount of about 40 to 80 volume %, preferred 60 to 65 volume %;

A-4, Volume ratio of large thermally conductive filler to small thermally conductive filler is about 1:2 to 20:1, preferably 2:1 to 10:1;
   A-5, Volume ratio of large thermally conductive filler to nano thermally conductive filler is about 1:3 to 15:1, preferably 2:3 to 6:1;
   A-6, Volume ratio of small thermally conductive filler to nano thermally conductive filler is about 5:1 to 1:5, preferably 1:1 to 1:3;
   (B) Composition II comprising controlled particle size ratio and volume percentage ratio as follows:
   B-1, Large thermally conductive filler has a particle size range from 20-40 um, preferred 23-28 um in an amount of about 45 to 75 volume %, preferred 58 to 62 volume %,
   B-2, Small thermally conductive filler has a particle size range from 5-20 um, preferred 8-12 um in an amount of about 5 to 40 volume %, preferred 15 to 25 volume %;
   B-3, Nano thermally conductive filler has a particle size range from 10-800 nm, preferred 100-300 nm in an amount of about 10 to 50 volume %, preferred 25 to 30 volume %;
   B-4, Volume ratio of large thermally conductive filler to small thermally conductive filler is about 1:3 to 15:1, preferably 3:2 to 8:1;
   B-5, Volume ratio of large thermally conductive filler to nano thermally conductive filler is about 1:2 to 10:1, preferably 2:1 to 5:1;
   B-6, Volume ratio of small thermally conductive filler to nano thermally conductive filler is about 3:2 to 1:4, preferably 1:1 to 1:3.

2. The thermally conductivity interface compositions as recited in claim 1 each providing a thermal conductivity of 4-8 W/mK with viscosity below 350 Pa·s and complex storage modulus below 100 kPa.

3. The thermally conductive interface compositions as recited in claim 1 each providing functioning as a heat dissipation media through being applied at the interface between an electronic component and a heat spreader, and between the heat spreader and a heat sink with a nominal average thickness of 250 um and below.

* * * * *